United States Patent
Kitagawa et al.

(10) Patent No.: US 10,840,434 B2
(45) Date of Patent: Nov. 17, 2020

(54) STORAGE DEVICE

(71) Applicant: TOSHIBA MEMORY CORPORATION, Minato-ku, Tokyo (JP)

(72) Inventors: Eiji Kitagawa, Seoul (KR); Young Min Eeh, Seongnam-si (KR); Tadaaki Oikawa, Seoul (KR); Kenichi Yoshino, Seongnam-si (KR); Kazuya Sawada, Seoul (KR); Taiga Isoda, Seoul (KR)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 16/352,279

(22) Filed: Mar. 13, 2019

(65) Prior Publication Data

US 2020/0091410 A1    Mar. 19, 2020

(30) Foreign Application Priority Data

Sep. 13, 2018 (JP) .................................. 2018-171328

(51) Int. Cl.
| | |
|---|---|
| *H01L 43/02* | (2006.01) |
| *G11C 11/16* | (2006.01) |
| *H01F 10/32* | (2006.01) |
| *H01L 27/22* | (2006.01) |
| *H01L 43/10* | (2006.01) |

(52) U.S. Cl.
CPC ............ *H01L 43/02* (2013.01); *G11C 11/161* (2013.01); *H01F 10/3254* (2013.01); *H01L 27/228* (2013.01); *H01L 43/10* (2013.01)

(58) Field of Classification Search
CPC ..... H01L 27/22; H01L 27/222; H01L 27/228; H01L 29/82; H01L 43/02; H01L 43/08; H01L 43/10; G11C 11/16; G11C 11/161; G11C 11/5607; G11C 2221/5315; H01F 10/3254
See application file for complete search history.

(56) References Cited

U.S. PATENT DOCUMENTS

| | | | |
|---|---|---|---|
| 6,166,948 | A | 12/2000 | Parkin et al. |
| 6,801,414 | B2 | 10/2004 | Amano et al. |
| 7,432,574 | B2 | 10/2008 | Nakamura et al. |
| 9,082,534 | B2 | 7/2015 | Chepulskyy et al. |

(Continued)

FOREIGN PATENT DOCUMENTS

| | | |
|---|---|---|
| JP | 4230179 B2 | 2/2009 |
| JP | 4729109 B2 | 7/2011 |

(Continued)

OTHER PUBLICATIONS

T. Newhouse-Illige, et al., "Voltage-controlled interlayer coupling in perpendicularly magnetized magnetic tunnel junctions," Nature Communications, 8:15232, 7 Pages.

(Continued)

*Primary Examiner* — David C Spalla
(74) *Attorney, Agent, or Firm* — Holtz, Holtz & Volek PC

(57) ABSTRACT

According to an embodiment, a storage device includes a resistance change element. The resistance change element includes a stacked structure including a first ferromagnet, a second ferromagnet, and a first nonmagnet between the first ferromagnet and the second ferromagnet. The first nonmagnet includes a boron-doped rare-earth oxide.

16 Claims, 8 Drawing Sheets

(56) References Cited

U.S. PATENT DOCUMENTS

| | | |
|---|---|---|
| 9,508,926 B2 | 11/2016 | Kitagawa et al. |
| 2008/0291585 A1* | 11/2008 | Yoshikawa ............ B82Y 10/00 360/324.11 |
| 2009/0243008 A1 | 10/2009 | Kitagawa et al. |
| 2012/0170357 A1 | 7/2012 | Apalkov et al. |
| 2013/0163315 A1 | 6/2013 | Yamane et al. |
| 2016/0171135 A1 | 6/2016 | Datta et al. |
| 2017/0263858 A1 | 9/2017 | Sonoda et al. |
| 2019/0080833 A1 | 3/2019 | Eeh et al. |
| 2019/0296226 A1* | 9/2019 | Eeh ........................ H01L 43/10 |

FOREIGN PATENT DOCUMENTS

| | | |
|---|---|---|
| JP | 2013115412 A | 6/2013 |
| JP | 5951401 B2 | 7/2016 |
| JP | 2019054054 A | 4/2019 |

OTHER PUBLICATIONS

Expired U.S. Appl. No. 62/394,708, filed Sep. 14, 2016, First Named Inventor: Youngmin Eeh, Title: "Semiconductor Device Having Rare Earth Oxide Layer and Method of Manufacturing the Same".

Related U.S. Appl. No. 16/123,846; First Named Inventor: Young Min Eeh; Title: "Magnetic Device and Manufacturing Method of Magnetic Device", filed Sep. 6, 2018.

* cited by examiner

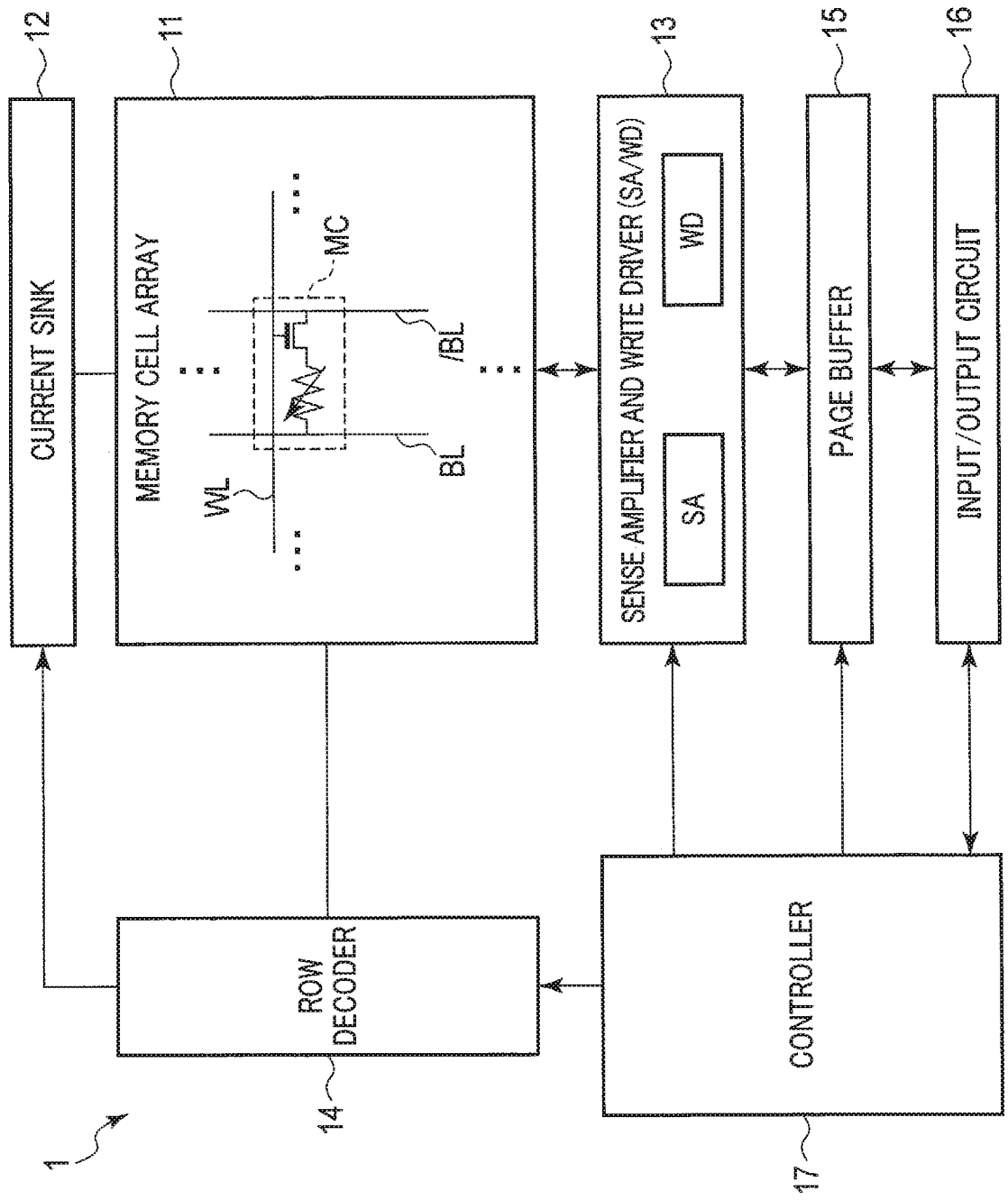
F I G. 1

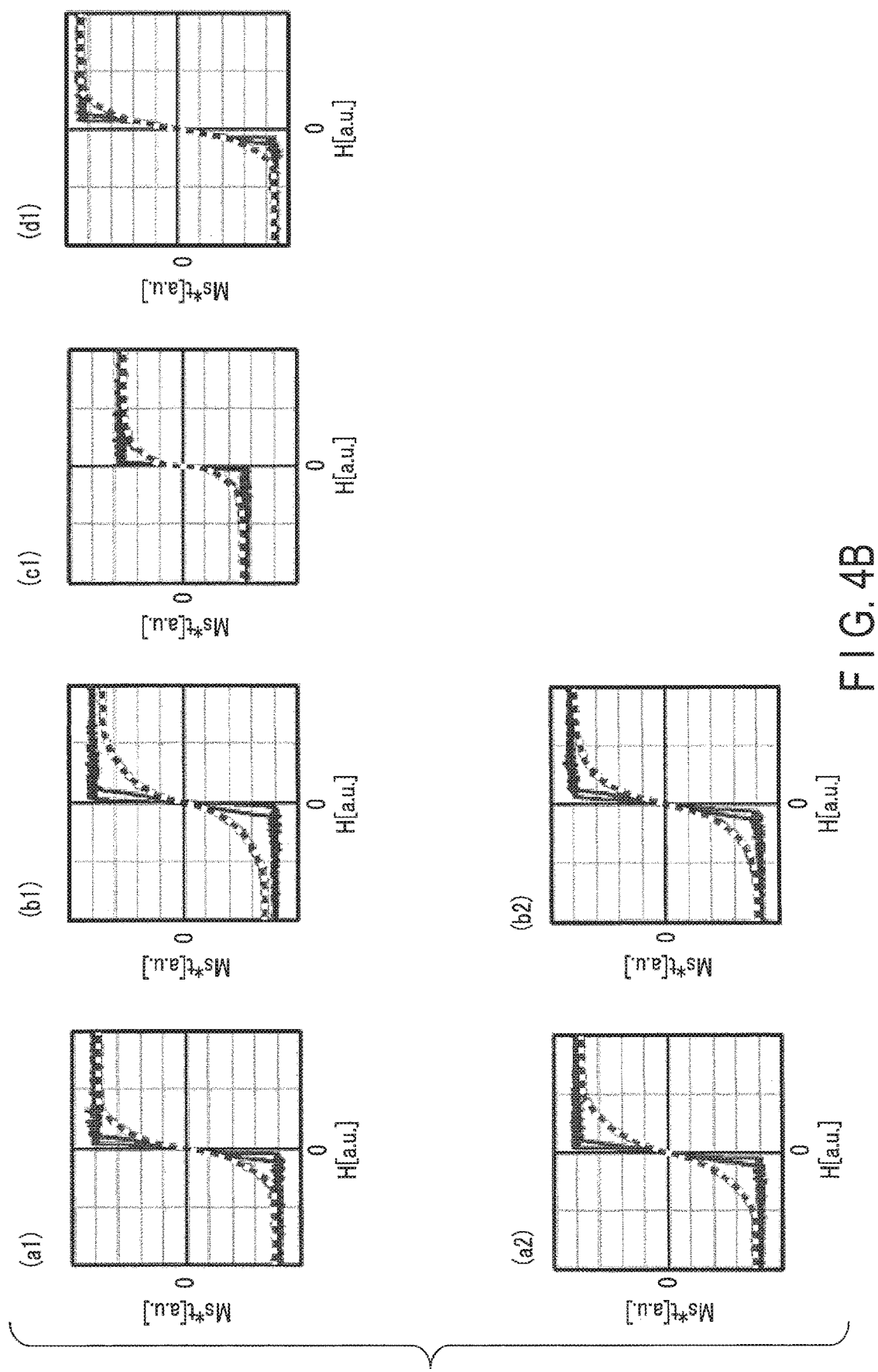
F I G. 4B

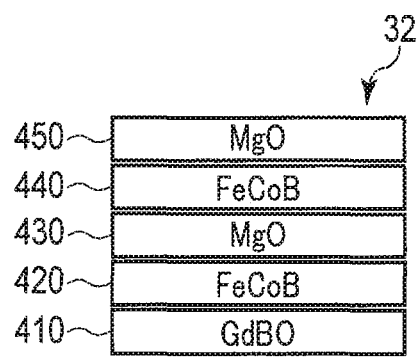
F I G. 7A
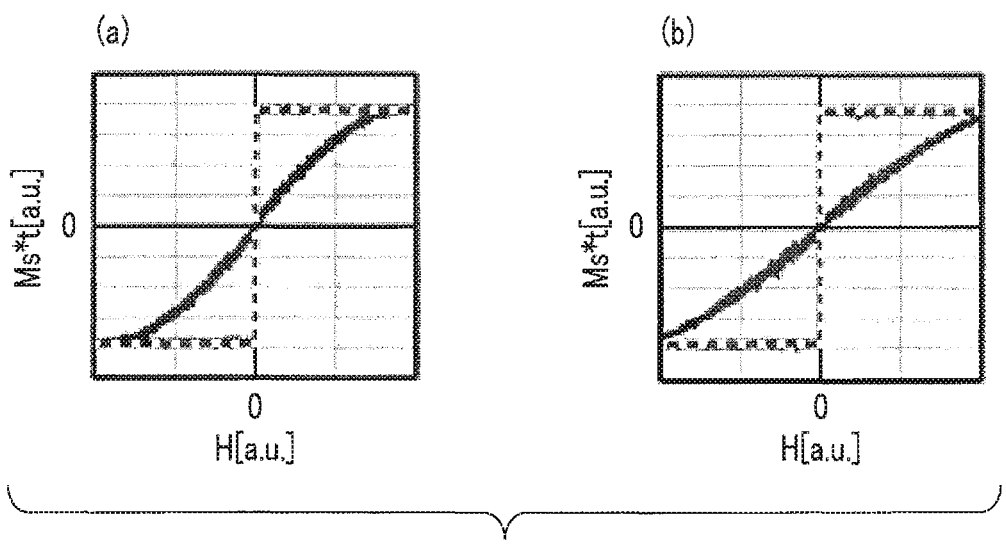
F I G. 7B

STORAGE DEVICE

CROSS-REFERENCE TO RELATED APPLICATIONS

This application is based upon and claims the benefit of priority from Japanese Patent Application No. 2018-171328, filed Sep. 13, 2018, the entire contents of which are incorporated herein by reference.

FIELD

Embodiments described herein relate generally to a storage device.

BACKGROUND

A storage device that includes a magnetic element is known.

BRIEF DESCRIPTION OF THE DRAWINGS

FIG. 1 is a block diagram showing an example of a configuration of a storage device according to a first embodiment.

FIG. 4B shows an example of graphs that plot an amount of magnetization measured when an external magnetic field is applied to the respective stacked structures shown in FIG. 4A.

FIG. 7A is a cross-sectional view of an exemplified stacked structure according to a comparative example of the first embodiment.

FIG. 7B shows an example of graphs that plot an amount of magnetization measured when an external magnetic field is applied to the stacked structure shown in FIG. 7A.

DETAILED DESCRIPTION

Figure 2:
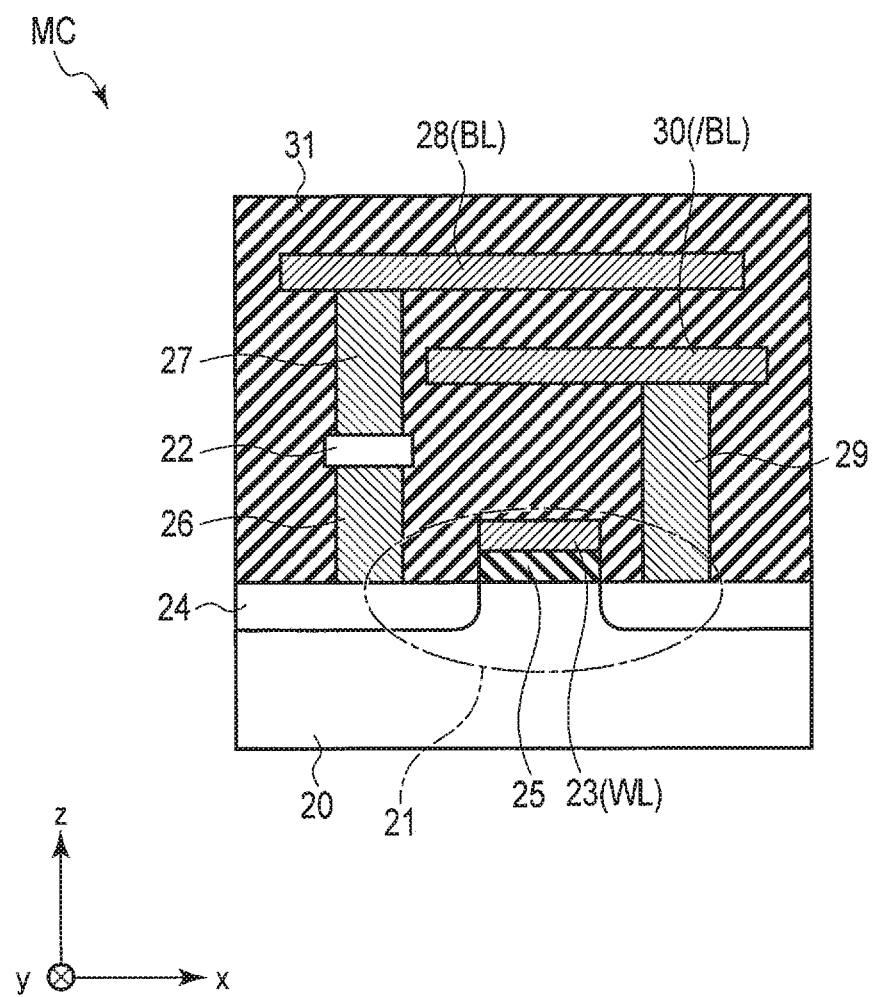
FIG. 2 is a cross-sectional view showing an example of a configuration of a memory cell of the storage device according to the first embodiment.

Generally, according to an embodiment, a storage device includes a resistance change element. The resistance change element includes a stacked structure including a first ferromagnet, a second ferromagnet, and a first nonmagnet between the first ferromagnet and the second ferromagnet. The first nonmagnet includes a boron-doped rare-earth oxide.

Hereinafter, embodiments will be explained with reference to the accompanying drawings. In the following explanation, structural elements having the same function and configuration will be denoted by the same reference symbols. In the case of distinguishing a plurality of structural elements having the same reference symbols, an index will be added to the same reference symbols for distinction. In the case where the structural elements do not need to be particularly distinguished, the structural elements are given only the same reference symbols.

First Embodiment

A storage device according to a first embodiment will be explained. The storage device according to the first embodiment includes, for example, a magnetic storage device (Magnetoresistive Random Access Memory (MRAM)) that is realized by a perpendicular magnetization system using, as a storage element, a resistance change element utilizing a Tunneling Magnetoresistance (TMR) effect caused by a Magnetic Tunnel Junction (MTJ). A TMR effect is a phenomenon in which a magnetic field is applied to change a magnetization direction of a ferromagnet, thereby changing an electrical resistance of when a tunnel current flows. In the following explanation, the above-mentioned magnetic storage device will be explained as an example of the storage device.

Configuration Example (1) Configuration of Storage Device

First of all, a configuration of a storage device according to a first embodiment will be explained.

FIG. 1 is a block diagram showing an example of a configuration of a storage device 1 according to the first embodiment. As shown in FIG. 1, the storage device 1 includes a memory cell array 11, a current sink 12, a sense amplifier and write driver (SA/WD) 13, a row decoder 14, a page buffer 15, an input/output circuit 16, and a controller 17.

The memory cell array 11 includes a plurality of memory cells MC associated with rows and columns. For example, the memory cells MC associated with a same row are coupled to a same word line WL. For example, first terminals of the memory cells MC associated with a same column are coupled to a same bit line BL, and second terminals of the memory cells MC associated with a same column are coupled to a same source line/BL.

The current sink 12 is coupled to the bit lines BL and the source lines/BL. In operations, such as writing and reading data, the current sink 12 provides bit lines BL or source lines/BL with a ground potential.

The SA/WD 13 includes write drivers WD and sense amplifiers SA. For example, each of the write drivers WD is coupled to a corresponding bit line BL and source line/BL. For example, each of the sense amplifiers SA is coupled to a corresponding bit line BL. Each of the write drivers WD supplies a current to a target memory cell MC via the corresponding bit line and source line/BL, and writes data on the memory cell MC. Each of the sense amplifiers SA supplies a current to a target memory cell MC via the corresponding bit line BL, and reads data from the memory cell MC.

The row decoder 14 is coupled to the memory cell array 11 via word lines WL. The row decoder 14 decodes a row address that designates a word line WL to which the memory cell array 11 is connected. Subsequently, the row decoder 14 selects the word line WL designated by the decoded row address, and applies a voltage that would enable operations such as writing and reading data to the selected word line WL.

The page buffer 15 temporarily holds data to be written in the memory cell array 11 and data read from the memory cell array 11 in a unit of data, called a "page".

The input/output circuit 16 transmits various signals received from the outside of the storage device 1 to the controller 17 and the page buffer 15, and transmits various information from the controller 17 and the page buffer 15 to the outside of the storage device 1.

The controller 17 is coupled to the current sink 12, the SA/WD 13, the row decoder 14, the page buffer 15, and the input/output circuit 16. In accordance with the various signals received from the outside of the storage device 1 by the input/output circuit 16, the controller 17 controls the current sink 12, the SA/WD 13, the row decoder 14, and the page buffer 15.

(2) Configuration of Memory Cell

A configuration of a memory cell of the storage device according to the first embodiment will be explained.

FIG. 2 is a cross-sectional view showing an example of a configuration of the memory cell MC of the storage device 1 according to the first embodiment. In the following explanation, a plane parallel to a semiconductor substrate 20 is defined as an xy-plane, and an axis, for example, perpendicular to the xy-plane is defined as a z-axis. An x-axis and a y-axis are defined as axes that are, for example, orthogonal to each other within the xy-plane. The cross-sectional view shown in FIG. 2 corresponds to that obtained by cutting the memory cell MC by the xz-plane. In the following explanation, the positive direction of the z-axis will be referred to as "upward", and the negative direction of the z-axis will be referred to as "downward".

As shown in FIG. 2, the memory cell MC is provided on the semiconductor substrate 20, and includes a select transistor 21 and a resistance change element 22. The select transistor 21 is provided as a switch for controlling supplying and stopping a current when data is written to and read from the resistance change element 22. The resistance change element 22 includes, for example, a plurality of stacked substances. A current that flows in a direction that penetrates an interface between layers, for example, in a direction perpendicular to the interface between the layers, allows a resistance value of the resistance change element 22 to be switched between a low-resistance state and a high-resistance state. By utilizing the change in the resistance state, data can be written to the resistance change element 22, and the resistance change element 22 holds the written data in a non-volatile manner, and functions as a storage element from which such data can be read.

The select transistor 21 includes a gate connected to a wiring layer 23 that functions as a word line WL, and a pair of source region and drain region 24 that is provided on a surface of the semiconductor substrate 20 at both ends of the gate along an x-direction. The select transistor 21 is formed in an active region of the semiconductor substrate 20. For example, the active region is insulated by an element isolating region (Shallow Trench Isolation (STI)) (not shown) so as not to be electrically connected to active regions of other memory cells MC.

The wiring layer 23 is provided along a y-direction via an insulation layer 25 on the semiconductor substrate 20, and is commonly connected to, for example, gates of select transistors 21 (not shown) of other memory cells MC disposed along the y-direction. Wiring layers 23 are disposed, for example, in the x-direction.

A contact plug 26 is provided on one of the source region 24 or the drain region 24 of the select transistor 21. The resistance change element 22 is provided on an upper surface of the contact plug 26. A contact plug 27 is provided on an upper surface of the resistance change element 22. An upper surface of the contact plug 27 is connected to a wiring layer 28. The wiring layer 28 functions as a bit line BL, is provided along the x-direction, and is commonly connected to, for example, the resistance change elements 22 (not shown) of other memory cells MC disposed in the x-direction.

A contact plug 29 is provided on the other source region 24 or drain region 24 of the select transistor 21. An upper surface of the contact plug 29 is connected to a wiring layer 30. The wiring layer 30 functions as a source line/BL, is provided along the x-direction, and is commonly connected to, for example, the select transistors 21 (not shown) of other memory cells MC disposed in the x-direction.

Both wiring layers 28 and wiring layers 30 are disposed, for example, in the y-direction. The wiring layer 28 is positioned, for example, above the wiring layer 30. The select transistor 21, the resistance change element 22, the wiring layers 23, 28, and 30, as well as the contact plugs 26, 27, and 29 are covered by an interlayer insulation film 31.

The other resistance change elements 22 (not shown) that are disposed along the x-direction or the y-direction with respect to the resistance change element 22 are provided on, for example, the same layer level. In other words, in the memory cell array 11, a plurality of resistance change elements 22 are disposed along directions in which, for example, the semiconductor substrate 20 spreads out.

(3) Configuration of Resistance Change Element

A configuration of a resistance change element of the storage device according to the first embodiment will be explained.

Figure 3:
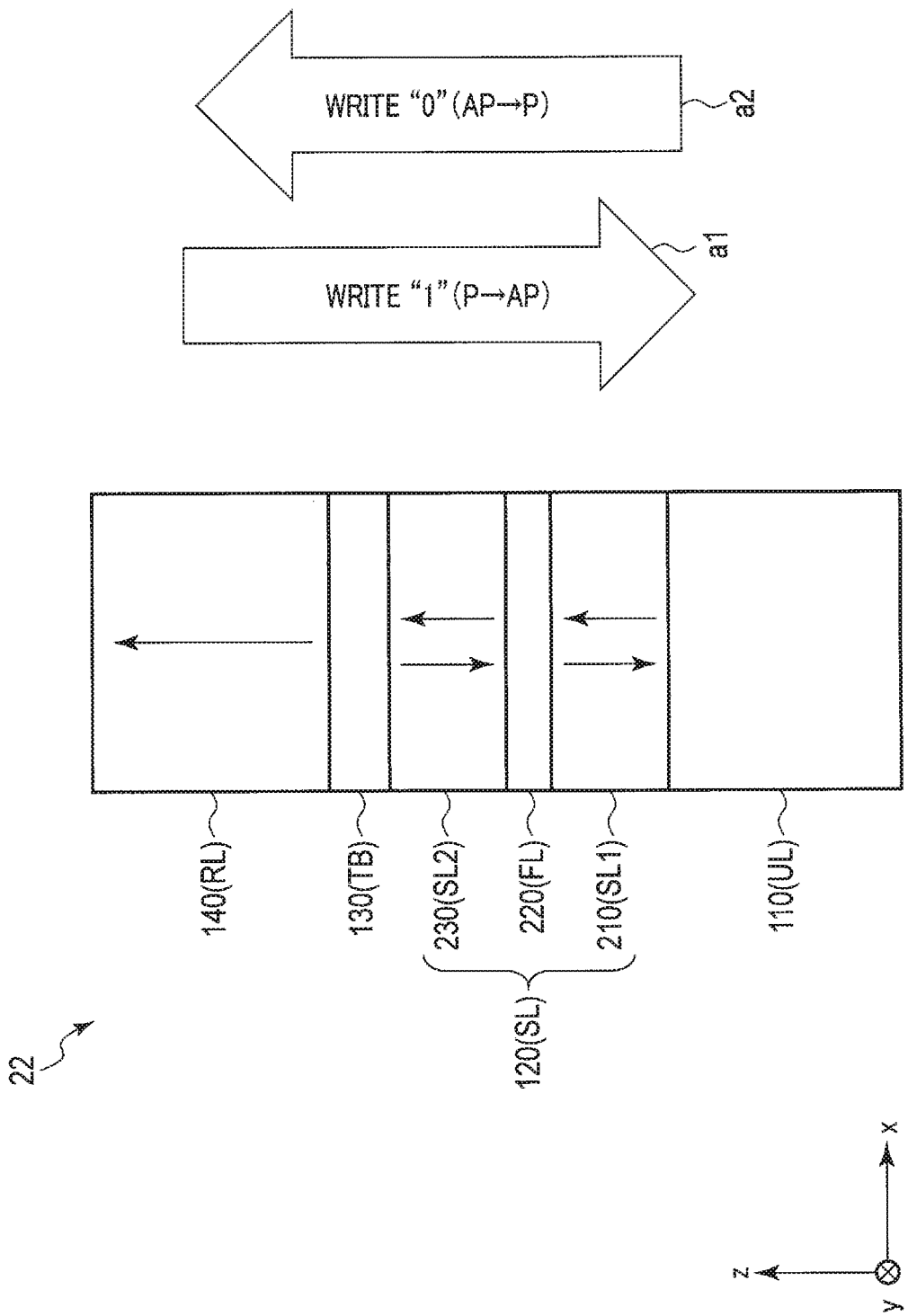
FIG. 3 is a cross-sectional view showing an example of a configuration of a resistance change element of the storage device according to the first embodiment.

FIG. 3 is a cross-sectional view showing an example of a configuration of the resistance change element 22 of the storage device 1 according to the first embodiment. The cross-sectional view shown in FIG. 3 corresponds to that obtained by cutting the resistance change element 22 by the xz-plane mentioned above.

As shown in FIG. 3, the resistance change element 22 includes a nonmagnet 110, a stacked structure 120, a nonmagnet 130, and a ferromagnet 140. The nonmagnet 110, the stacked structure 120, the nonmagnet 130, and the ferromagnet 140 are stacked in the positive direction of the z-axis from the semiconductor substrate 20 side in the order of the nonmagnet 110, the stacked structure 120, the nonmagnet 130, and the ferromagnet 140.

The nonmagnet 110 functions as, for example, an under layer. The nonmagnet 130 functions as, for example, a tunnel barrier layer. In other words, the stacked structure 120, the nonmagnet 130, and the ferromagnet 140 form a magnetic tunnel junction. The ferromagnet 140 has magnetization that is fixed in a certain direction, and functions as, for example, a reference layer.

In a steady state, the stacked structure 120 has variable magnetization along a certain direction, and functions as, for example, a storage layer. A steady state indicates a state in which a voltage is not applied, a state of not being positioned in an external magnetic field, and a state where transition of the state of magnetization is ended and is stable.

A set of the stacked structure 120, the nonmagnet 130, and the ferromagnet 140 produces a TMR effect. A TMR effect is a phenomenon in which, in a structure including two ferromagnets with an insulator therebetween, the structure shows a minimum resistance value when directions of magnetization of the two ferromagnets are in parallel, and shows a maximum resistance value when the directions of magnetization of the two ferromagnets are antiparallel. The resistance change element 22 may take one of a low-resistance state and a high-resistance state depending on whether the magnetization direction of the stacked structure 120 is parallel or antiparallel with respect to the magnetization direction of the ferromagnet 140.

In the case where the magnetization direction of the ferromagnet 140 and the magnetization direction of the stacked structure 120 are in parallel, the resistance value of the resistance change element 22 is the lowest. In other words, the resistance change element 22 is set to the low-resistance state. This low-resistance state is called a "P (Parallel) state", and is defined as, for example, a state of data "0".

In the case where the magnetization direction of the ferromagnet 140 and the magnetization direction of the stacked structure 120 are antiparallel, the resistance value of the resistance change element 22 is the highest. In other words, the resistance change element 22 is set to the high-resistance state. This high-resistance state is called an "AP (Anti-Parallel) state", and is defined as, for example, a state of data "1".

The stacked structure 120 includes a ferromagnet 210, a nonmagnet 220, and a ferromagnet 230. The ferromagnet 210, the nonmagnet 220, and the ferromagnet 230 are stacked in the positive direction of the z-axis from the semiconductor substrate 20 side in the order of the ferromagnet 210, the nonmagnet 220, and the ferromagnet 230. The ferromagnet 210 functions as, for example, a first storage layer. The ferromagnet 230 functions as, for example, a second storage layer. The nonmagnet 220 functions as, for example, a function layer, and functions as a tunnel barrier layer. In other words, the ferromagnet 210, the nonmagnet 220, and the ferromagnet 230 form a magnetic tunnel junction, and can produce a TMR effect.

In the steady state, the magnetization of the ferromagnet 210 and the magnetization of the ferromagnet 230 face the same direction. Therefore, the magnetization direction of the stacked structure 120 is the magnetization directions of the ferromagnets 210 and 230 in the steady state.

In this manner, the structure functioning as the storage layer is realized by the two ferromagnets 210 and 230. The nonmagnet 220 provided between the ferromagnets 210 and 230 includes an oxide. By providing an oxide between the ferromagnets 210 and 230 in the above manner, an interface anisotropy, that directs the magnetizations of the ferromagnets 210 and 230 in a perpendicular direction with respect to an interface between the layers, occurs. Therefore, a perpendicular magnetization of the stacked structure 120 has higher thermal stability than in the case where the storage layer is formed by one ferromagnet. Furthermore, the two ferromagnets that have perpendicular magnetization are stabilized in a parallel state with respect to each other in order to minimize magnetostatic energy.

The resistance change element 22 shown in FIG. 3 is merely an exemplification, therefore, may also include a layer other than those mentioned above.

The nonmagnet 110, the stacked structure 120, the nonmagnet 130, and the ferromagnet 140 will be further explained.

The nonmagnet 110 has conductivity, and includes a nonmagnetic material. For example, the nonmagnet 110 includes at least one of compounds of oxide including the following metal elements, such as alkali metal, alkaline earth metal, and rare-earth metal; for example, magnesium oxide (MgO) and rare-earth oxide (YO, LaO, EuO, GdO), or of nitride including the following metal elements, such as alkali metal, base metal, and transition metal; for example, magnesium nitride (MgN), zirconium nitride (ZrN), niobium nitride (NbN), aluminum nitride (AlN), hafnium nitride (HfN), tantalum nitride (TaN), tungsten nitride (WN), chromium nitride (CrN), molybdenum nitride (MoN), titanium nitride (TiN), and vanadium nitride (VN), or of boride including 5d-transition metal; for example, HfB and TaB. Furthermore, the nonmagnet 110 may also include a composite of the above-mentioned oxide, nitride, or boride.

In other words, the nonmagnet 110 is not limited to a binary compound that is made of two kinds of elements, and may include a ternary compound made of three kinds of elements, such as boron-doped gadolinium oxide (GdBO).

The nonmagnet 130 has, for example, insulation properties, and includes a nonmagnetic material. For example, the nonmagnet 130 includes magnesium oxide (MgO).

The ferromagnet 140 has conductivity, and includes a ferromagnetic material that has a magnetization easy axis perpendicular to an interface between the ferromagnet 140 and another layer, for example, a magnetization easy axis along the z-axis. For example, the ferromagnet 140 includes an iron cobalt boron (FeCoB) as the ferromagnet having perpendicular magnetization. Furthermore, as an additional ferromagnet, the resistance change element 22 may include, on a side of the ferromagnet 140 opposite to the nonmagnet 130, at least one of cobalt platinum (CoPt), cobalt nickel (CoNi), and cobalt palladium (CoPd) having perpendicular magnetization combined in antiparallel to that of the ferromagnet 140. The magnitude of magnetization of the additional ferromagnet is larger than the magnitude of magnetization of the ferromagnet 140. For example, ruthenium (Ru) and iridium (Ir) are used to combine the magnetizations of the two ferromagnets in the antiparallel manner. The magnetization direction of the ferromagnet 140 is fixed and is directed either toward the stacked structure 120 side or toward the opposite side thereof (in the example of FIG. 3, it is directed toward the opposite side of the stacked structure 120 side). "The magnetization direction is fixed" means that the magnetization direction is not changed by the magnetic field or the current, etc. used in the present embodiment capable of inverting the magnetization direction of the stacked structure 120. In contrast, "the magnetization direction is variable" means that the magnetization direction is variable by the above-mentioned magnetic field or current, etc. Here, to invert the magnetization direction of the stacked structure 120 means to invert the magnetization direction of each of the ferromagnets 210 and 230 included in the stacked structure 120 so that the magnetization direction directed toward the semiconductor substrate 20 side or the ferromagnet 140 side is inverted to be directed toward the other side.

Each of the ferromagnets 210 and 230 has conductivity and includes a ferromagnetic material. For example, each of the ferromagnets 210 and 230 includes iron cobalt boron (FeCoB) or iron boride (FeB).

For example, a perpendicular magnetic anisotropy field (Hk) of the ferromagnet 210 is greater than a perpendicular magnetic anisotropy field of the ferromagnet 230. Furthermore (alternatively), a ferromagnetic resonance frequency (f) of the magnetization of the ferromagnet 210 is greater than a ferromagnetic resonance frequency of the magnetization of the ferromagnet 230. Furthermore (alternatively), a damping constant ($\alpha$) of the magnetization of the ferromagnet 210 is greater than a damping constant of the magnetization of the ferromagnet 230. To realize such a relationship, for example, the ferromagnet 210 may have a higher boron-containing rate than that of the ferromagnet 230. For example, control of the perpendicular magnetic anisotropy field or the ferromagnetic resonance frequency is enabled by making the boron-containing rate of the ferromagnet 230 smaller than 10% and making the boron-containing rate of the ferromagnet 210 equal to or greater than 10%. Furthermore (alternatively), the ferromagnet 210 may have a thinner film thickness than that of the ferromagnet 230. In addition to providing such magnitude relationship for the perpendicular magnetic anisotropy field, the ferromagnetic resonance frequency, and (or) the damping constant of the ferromagnets 210 and 230, the ferromagnets 210 and 230 may be configured in the following manner. For example, an amount of magnetization (Mst) of the ferromagnet 210 is smaller than an amount of magnetization of the ferromagnet 230. The amount of magnetization is obtained by a product of a saturation magnetization (Ms) and a film thickness of the ferromagnet. To realize such a relationship, for example, the ferromagnet 210 may have a smaller saturation magnetization than that of the ferromagnet 230. Furthermore (alternatively), the ferromagnet 210 may have a thinner film thickness than that of the ferromagnet 230. In order to adjust the perpendicular magnetic anisotropy field, the ferromagnetic resonance frequency, the damping constant, and the Ms of the ferromagnet 210, a transition metal, such as Hf, Ta, W, Re, Ir, Pt, Au, Zr, Nb, Mo, Ru, Rh, Pd, Ag, Ti, V, Cr, Mn, Ni, and Cu, may be contained in iron cobalt boron (FeCoB) or iron boride (FeB).

The nonmagnet 220 is, for example, dielectric and shows insulation properties, and includes an oxide of a rare-earth element (RE) that is doped with (contains) boron. The nonmagnet 220 functions as a tunnel barrier layer. The oxide of the rare-earth element that is doped with boron (hereinafter referred to merely as "boron-doped rare-earth oxide" (RE-B—O)) includes at least one oxide among, for example, scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). In the case where the nonmagnet 220 is sandwiched between two ferromagnets, the nonmagnet 220 having such material characteristics is able to maintain perpendicular magnetic anisotropy (PMA) of the two ferromagnets. In other words, the ferromagnets 210 and 230 have magnetization easy axes that are directed in a direction penetrating an interface between the ferromagnets 210 and 230 and another layer, and have, for example, the magnetization easy axes along the z-axis. Therefore, each of the magnetization directions of the ferromagnets 210 and 230, and the ferromagnet 140 is perpendicular to the interface between the layers.

Each of the magnetization directions of the ferromagnets 210 and 230 is switchable along the magnetization easy axis; and data can be written on the resistance change element 22 by switching each of the magnetization directions of the ferromagnets 210 and 230. To realize the switching of the magnetization directions, a spin-injection write system can be adopted for the storage device 1. In the spin-injection write system, a write current is directly flowed in the resistance change element 22, and the magnetization direction of the stacked structure 120 is controlled by this write current. In other words, a spin-transfer torque (STT) effect generated by the write current is utilized.

When the write current is flowed in the resistance change element 22 in an arrow a1 direction shown in FIG. 3, that is, in a direction from the ferromagnet 140 toward the stacked structure 120, the magnetization direction of the stacked structure 120 becomes antiparallel to the magnetization direction of the ferromagnet 140.

When the write current is flowed in the resistance change element 22 in an arrow a2 direction shown in FIG. 3, that is, in a direction from the stacked structure 120 toward the ferromagnet 140, the magnetization direction of the stacked structure 120 becomes parallel to the magnetization direction of the ferromagnet 140.

(4) Perpendicular Magnetic Anisotropy of Ferromagnet as Storage Layer

The stacked structure 120 having perpendicular magnetic anisotropy in the manner mentioned above will be explained.

Figure 4A:
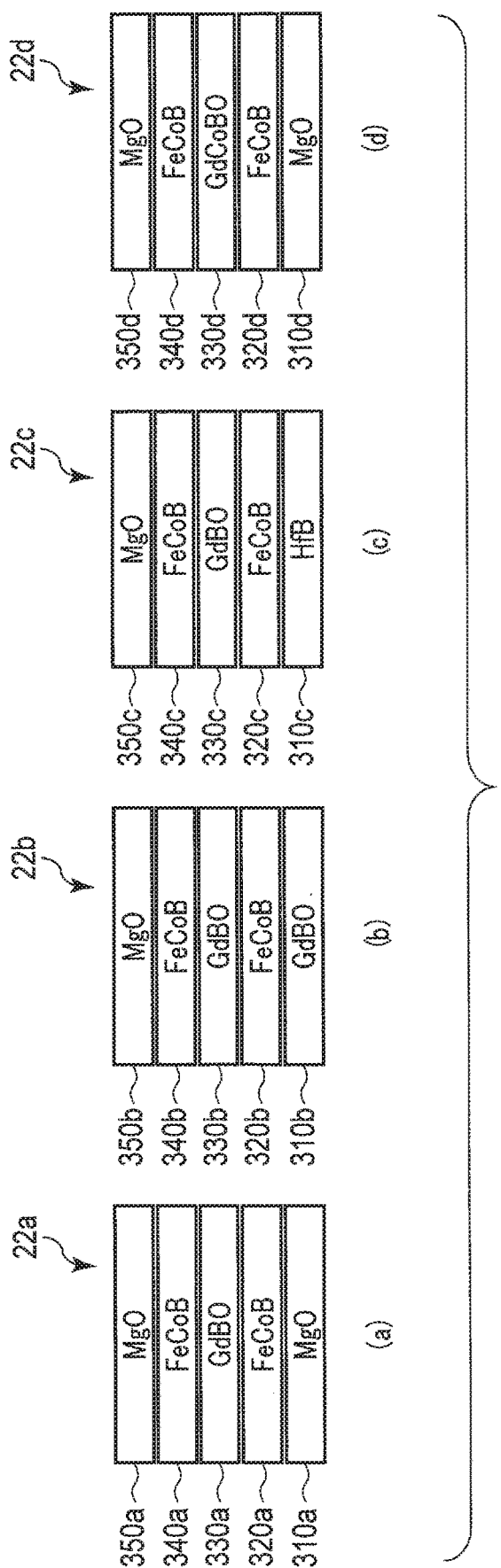
FIG. 4A shows a cross-sectional view of an exemplified stacked structure including an example of the stacked structure shown in FIG. 3, and cross-sectional views of exemplified stacked structures each including a configuration similar to the stacked structure shown in FIG. 3.

FIG. 4A shows a cross-sectional view of an exemplified stacked structure including an example of the stacked structure 120 shown in FIG. 3, and cross-sectional views of exemplified stacked structures each including a configuration similar to the stacked structure 120 shown in FIG. 3. The configuration of each stacked structure will be explained in detail; however, each layer that is explained as being included in each of the stacked structures may include an appropriate substance other than the substance explicitly mentioned below.

In a stacked structure 22a shown in FIG. 4A (a), layers are stacked in the order of a magnesium oxide (MgO) layer 310a, an iron cobalt boron (FeCoB) layer 320a, a boron-doped gadolinium oxide (GdBO) layer 330a, an iron cobalt boron (FeCoB) layer 340a, and a magnesium oxide (MgO) layer 350a. Layers 320a and 340a have the same boron-containing rate and film thickness.

In a stacked structure 22b shown in FIG. 4A (b), layers are stacked in the order of a boron-doped gadolinium oxide (GdBO) layer 310b, an iron cobalt boron (FeCoB) layer 320b, a boron-doped gadolinium oxide (GdBO) layer 330b, an iron cobalt boron (FeCoB) layer 340b, and a magnesium oxide (MgO) layer 350b. Layers 320b and 340b have the same boron-containing rate and film thickness.

In a stacked structure 22c shown in FIG. 4A (c), layers are stacked in the order of a hafnium boride (HfB) layer 310c, an iron cobalt boron (FeCoB) layer 320c, a boron-doped gadolinium oxide (GdBO) layer 330c, an iron cobalt boron (FeCoB) layer 340c, and a magnesium oxide (MgO) layer 350c. In comparison to layer 340c, layer 320c has a higher boron-containing rate, and a thinner film thickness. Therefore, in comparison to layer 340c, layer 320c has a stronger perpendicular magnetic anisotropy field.

In a stacked structure 22d shown in FIG. 4A (d), layers are stacked in the order of a magnesium oxide (MgO) layer 310d, an iron cobalt boron (FeCoB) layer 320d, a boron-doped gadolinium cobalt oxide (GdCoBO) layer 330d, an iron cobalt boron (FeCoB) layer 340d, and a magnesium oxide (MgO) layer 350d. Layers 320d and 340d have the same boron-containing rate and film thickness.

The stacked structure 22c shown in FIG. 4A (c) is a stacked structure that includes the example of the stacked structure 120 included in the resistance change element 22 mentioned above. Specifically, a portion formed by layer 320c, layer 330c, and layer 340c included in the stacked structure 22c corresponds to the stacked structure 120 including the ferromagnet 210, the nonmagnet 220, and the ferromagnet 230. On the other hand, each of the stacked structures shown in FIG. 4A, (a), (b), and (d) includes a configuration similar to that of the stacked structure 120 included in the resistance change element 22 mentioned above. For example, a portion formed by layer 320a, layer 330a, and layer 340a included in the stacked structure 22a shown in FIG. 4A (a), a portion formed by layer 320b, layer 330b, and layer 340b included in the stacked structure 22b shown in FIG. 4A (b), and a portion formed by layer 320d, layer 330d, and layer 340d included in the stacked structure 22d shown in FIG. 4A (d) correspond to the stacked structure 120 in terms of substances included in each layer.

FIG. 4B shows an example of graphs plotting an amount of magnetization indicated by the portion corresponding to the stacked structure 120 among the respective stacked structures, that is measured when an external magnetic field is applied to the respective stacked structures shown in FIG. 4A. In the graphs shown in FIG. 4B, an amount of magnetization in a case where a magnetic field is applied in a direction perpendicular to an interface between layers of the respective stacked structures is plotted by a solid line, and an amount of magnetization in a case where a magnetic field is applied in a direction parallel to an interface between layers of the respective stacked structures is plotted by a dotted line.

Specifically, in the graph of FIG. 4B (a1), an amount of magnetization indicated by the portion formed by layer 320a, layer 330a, and layer 340a in the stacked structure 22a is plotted. Similarly, an amount of magnetization indicated by the portion formed by layer 320b, layer 330b, and layer 340b in the stacked structure 22b is plotted in the graph of FIG. 4B (b1); an amount of magnetization indicated by the portion formed by layer 320c, layer 330c, and layer 340c in the stacked structure 22c is plotted in the graph of FIG. 4B (c1); and an amount of magnetization indicated by the portion formed by layer 320d, layer 330d, and layer 340d in the stacked structure 22d is plotted in the graph of FIG. 4B (d1).

Furthermore, in the graph of FIG. 4B (a2), an amount of magnetization indicated by a portion formed by layer 320a, layer 330a, and layer 340a in the case where the film thickness of layer 330a in the stacked structure 22a is made thin is plotted. In the graph of FIG. 4B (b2), an amount of magnetization indicated by a portion formed by layer 320b, layer 330b, and layer 340b in the case where the film thickness of layer 330b in the stacked structure 22b is made thin is plotted.

In all of the graphs shown in FIG. 4B, it is understood that an amount of magnetization of when an external magnetic field of zero or around zero is applied is greater in the case where the external magnetic field is applied in the perpendicular direction to an interface than in the case where it is applied in the parallel direction to an interface, and that the portion corresponding to the stacked structure 120 among each of the stacked structures shown in FIG. 4A has a perpendicular magnetic anisotropy. Therefore, it is understood that the stacked structure 120 similarly has a perpendicular magnetic anisotropy.

Operation Example

A write operation of the storage device according to the first embodiment will be explained.

In the following explanation, a memory cell MC of a write-target will be referred to as a "selected memory cell MC". Each of a bit line BL, a source line/BL, and a word line WL corresponding to the selected memory cell MC will be referred to as a "selected bit line BL", a "selected source line/BL", and a "selected word line WL". On the other hand, each of bit lines BL, source lines/BL, and word lines WL that does not correspond to the selected memory cell MC will be referred to as "unselected bit lines BL", "unselected source lines/BL", and "unselected word lines WL".

An "H" level voltage that turns on a select transistor 21 included in the selected memory cell MC is applied to the selected word line WL. On the other hand, an "L" level voltage that turns off select transistors 21 included in corresponding memory cells MC is supplied to the unselected word lines WL. By such control, and by providing a potential difference between the selected bit line BL and the selected source line/BL, the write current flows to a resistance change element 22 included in the selected memory cell MC, which allows the resistance change element 22 to be set to a low-resistance state or a high-resistance state by the spin injection write system explained with reference to FIG. 3.

Figure 5:
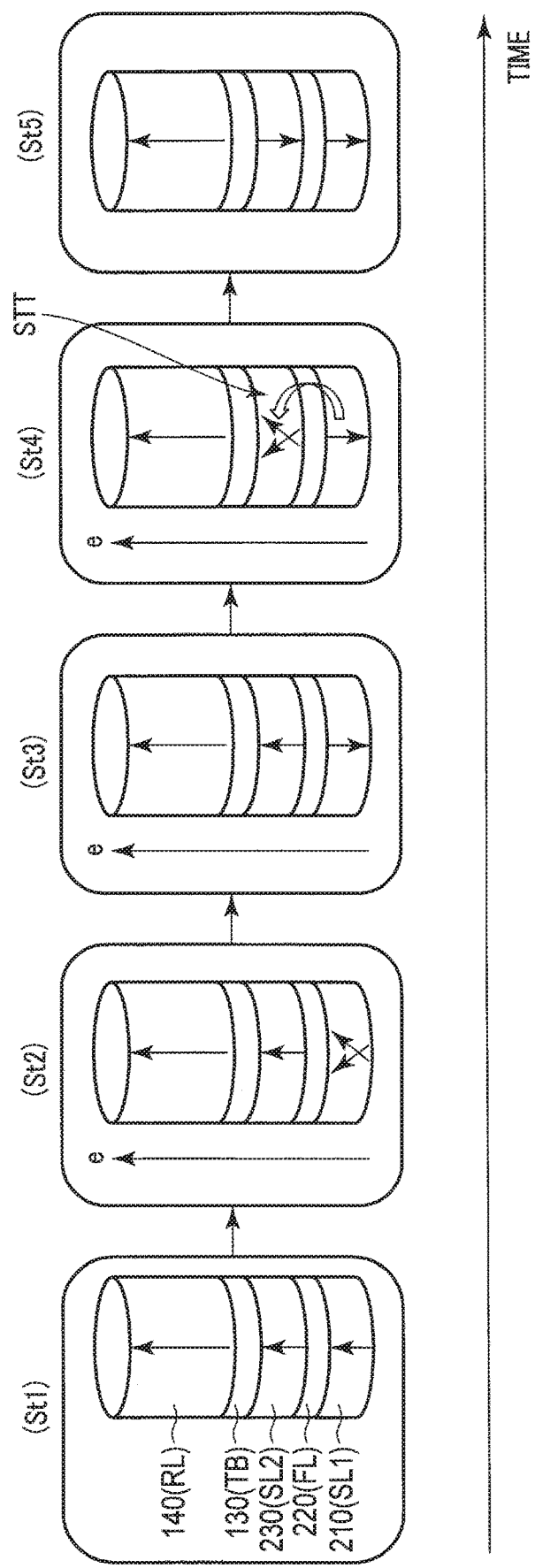
FIG. 5 is a schematic view showing an example of a write operation for setting the resistance change element to a high-resistance state in the storage device according to the first embodiment.

FIG. 5 is a schematic view showing an example of the write operation for setting the resistance change element 22 to the high-resistance state from the low-resistance state by flowing the write current to the resistance change element 22 in the storage device 1 according to the first embodiment.

First, in state St1, the magnetization directions of the ferromagnets 210 and 230 are made parallel to the magnetization direction of the ferromagnet 140. Here, the resistance change element 22 is in the low-resistance state explained with reference to FIG. 3.

Next, in state St2, electrons e derived as the write current flow in a direction from the ferromagnet 210 to the ferromagnet 140 of the resistance change element 22. An electron e with majority spin flowing in the direction from the ferromagnet 210 to the ferromagnet 140 have a spin in the same direction as the magnetization directions of the ferromagnets 210 and 230, and merely pass through the ferromagnets 210 and 230. On the other hand, an electron e with minority spin flowing in the direction from the ferromagnet 210 to the ferromagnet 140 have a spin in an opposite direction of the magnetization directions of the ferromagnets 210 and 230. By such electrons e, a spin torque with a magnetization direction antiparallel to the magnetization direction of the ferromagnet 140 is injected into the ferromagnets 210 and 230. The magnetization directions of the ferromagnets 210 and 230 are affected by the injection of the spin torque. Here, of the ferromagnets 210 and 230, the magnetization direction of the ferromagnet 210 first starts inverting in a direction antiparallel to the magnetization direction of the ferromagnet 140. This is because the frequency of precession of the spin increases, which increases a rotation speed, since the perpendicular magnetic anisotropy field of the ferromagnet 210 is greater than the perpendicular magnetic anisotropy field of the ferromagnet 230, or the ferromagnetic resonance frequency of the magnetization of the ferromagnet 210 is greater than the ferromagnetic resonance frequency of the magnetization of the ferromagnet 230, or the damping constant of the magnetization of the ferromagnet 210 is greater than the damping constant of the magnetization of the ferromagnet 230. Furthermore, a stray magnetic field from the ferromagnet 140 also makes it difficult for the magnetization direction of the ferromagnet 230 that is positioned closer to the ferromagnet 140 than the ferromagnet 210 to be inverted.

In state St3, although the inversion of the magnetization direction of the ferromagnet 210 is completed, the above-mentioned write current continues to flow in the resistance change element 22 thereafter.

In state St4, electrons e that is spin-polarized by the ferromagnet 210, etc. flow into the ferromagnet 230.

Exchange interaction occurs between the spin-polarized electron e and an electron of the ferromagnet 230. As a result, a spin torque is generated between the spin-polarized electron e and the electron of the ferromagnet 230. An electron e with majority spin flowing into the ferromagnet 230 have a spin in the same direction as the magnetization direction of the ferromagnet 210. Furthermore, an electron e with minority spin flowing in a direction from the ferromagnet 230 to the ferromagnet 140 have a spin in an opposite direction of the magnetization direction of the ferromagnet 230. By such electrons e, a spin torque with a magnetization direction antiparallel to the magnetization direction of the ferromagnet 140 is injected into the ferromagnet 230. Therefore, by the spin torque, the magnetization direction of the ferromagnet 230 also starts inverting in a direction antiparallel to the magnetization direction of the ferromagnet 140. In this manner, the STT is generated between the ferromagnet 210 and the ferromagnet 230.

By continuously supplying the write current, in state St5, the inversion of the magnetization direction of the ferromagnet 230 is also completed. Here, the magnetization directions of the ferromagnets 210 and 230 are antiparallel to the magnetization direction of the ferromagnet 140. In other words, the resistance change element 22 is set to the high-resistance state explained with reference to FIG. 3.

Figure 6:
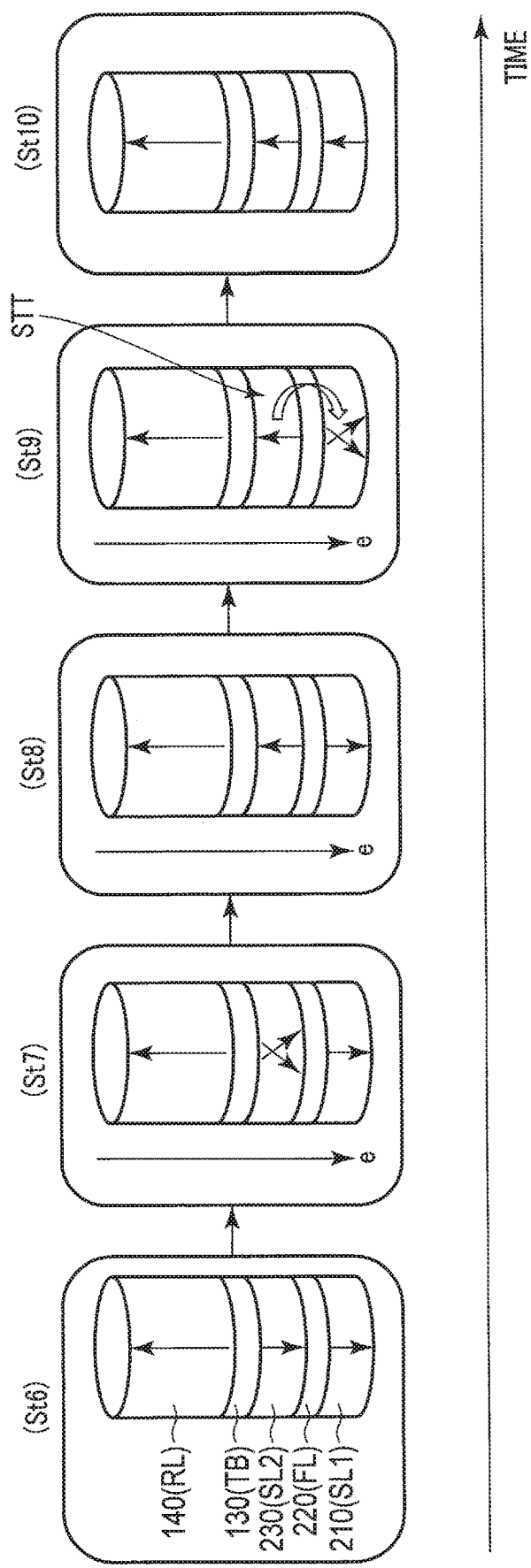
FIG. 6 is a schematic view showing an example of a write operation for setting the resistance change element to a low-resistance state in the storage device according to the first embodiment.

FIG. 6 is a schematic view showing an example of the write operation for setting the resistance change element 22 to the low-resistance state from the high-resistance state by flowing the write current to the resistance change element 22 in the storage device 1 according to the first embodiment.

First, in state St6, the magnetization directions of the ferromagnets 210 and 230 are antiparallel to the magnetization direction of the ferromagnet 140. Here, the resistance change element 22 is in the high-resistance state explained with reference to FIG. 3.

Next, in state St7, electrons e derived as the write current flow in a direction from the ferromagnet 140 to the ferromagnet 210 of the resistance change element 22. An electron e with majority spin flowing into the ferromagnet 230 are spin-polarized by the ferromagnet 140, and have a spin in the same direction as the magnetization direction of the ferromagnet 140. Exchange interaction occurs between the spin-polarized electron e and an electron of the ferromagnet 230. As a result, a spin torque is generated between the spin-polarized electron e and the electron of the ferromagnet 230. By the spin torque, the magnetization direction of the ferromagnet 230 starts inverting in a direction parallel to the magnetization direction of the ferromagnet 140.

In state St8, although the inversion of the magnetization direction of the ferromagnet 230 is completed, the above-mentioned write current continues to flow in the resistance change element 22 thereafter.

In state St9, electrons e that is spin-polarized by the ferromagnet 230, etc. flow into the ferromagnet 210. Exchange interaction occurs between the spin-polarized electron e and an electron of the ferromagnet 210. As a result, a spin torque is generated between the spin-polarized electron e and the electron of the ferromagnet 210. An electron e with majority spin flowing into the ferromagnet 210 have a spin in the same direction as the magnetization direction of the ferromagnet 230. Therefore, by the spin torque, the magnetization direction of the ferromagnet 210 also starts inverting in a direction parallel to the magnetization direction of the ferromagnet 140. In this manner, even when the resistance change element 22 is set to the low-resistance state from the high-resistance state, the STT is generated between the ferromagnet 210 and the ferromagnet 230.

By continuously supplying the write current, in state St10, the inversion of the magnetization direction of the ferromagnet 210 is completed. Here, the magnetization directions of the ferromagnets 210 and 230 are parallel to the magnetization direction of the ferromagnet 140. In other words, the resistance change element 22 is set to the low-resistance state explained with reference to FIG. 3.

Since the nonmagnet 220 including, for example, a boron-doped rare-earth oxide is dielectric, the nonmagnet 220 is able to exercise a Voltage-Controlled Magnetic Anisotropy (VCMA) effect that changes a magnetic property by an electric field generally generated on an interface between an insulator and a magnetic body. In the example of the write operation explained with reference to FIG. 5 and FIG. 6, the VCMA effect by the nonmagnet 220 may be utilized. For example, by utilizing the VCMA effect upon the inversion of the magnetization direction of the ferromagnet 210 in state St2 and the inversion of the magnetization direction of the ferromagnet 230 in state St7, an energy barrier of the inversion of the magnetization direction can be lowered.

[Effects]

In the case where a structure including two ferromagnets is used as a storage layer, the inversion of magnetization directions of the two ferromagnets can be performed efficiently by using a STT between the two ferromagnets, thereby reducing a write current to such storage layer. For the purpose of using the STT, MgO may be used between the ferromagnets. FIG. 7A shows such example, and is a cross-sectional view of an exemplified stacked structure 32 according to a comparative example of the above first embodiment.

In the stacked structure 32, layers are stacked in the order of a boron-doped gadolinium oxide (GdBO) layer 410, an iron cobalt boron (FeCoB) layer 420, a magnesium oxide (MgO) layer 430, an iron cobalt boron (FeCoB) layer 440, and a magnesium oxide (MgO) layer 450. In the stacked structure 32, in comparison to the stacked structure 22b shown in FIG. 4A (b), other than that the magnesium oxide (MgO) layer 430 is included instead of the boron-doped gadolinium oxide (GdBO) layer 330b, each of the other layers has the same structure material and film thickness.

FIG. 7B shows an example of graphs plotting an amount of magnetization indicated by a portion formed by the layer 420, the layer 430, and the layer 440 in the stacked structure 32, that is measured when an external magnetic field is applied to the stacked structure 32 shown in FIG. 7A. In the graphs shown in FIG. 7B, an amount of magnetization in a case where a magnetic field is applied in a direction perpendicular to an interface between layers of the stacked structure 32 is plotted by a solid line, and an amount of magnetization in a case where a magnetic field is applied in a direction parallel to an interface between layers of the stacked structure 32 is plotted by a dotted line.

Specifically, in the graph of FIG. 7B (a), an amount of magnetization indicated by the portion formed by the layer 420, the layer 430, and the layer 440 in the stacked structure 32 is plotted. In the graph of FIG. 7B (b), an amount of magnetization indicated by a portion formed by the layer 420, the layer 430, and the layer 440 in the case where the film thickness of the layer 430 is made thin is plotted.

In both of the graphs shown in FIG. 7B, it is understood that an amount of magnetization of when an external magnetic field of zero or around zero is applied is greater in the case where the external magnetic field is applied in the parallel direction to an interface than in the case where it is applied in the perpendicular direction to an interface, and that, in the stacked structure 32 shown in FIG. 7A, the iron cobalt boron (FeCoB) layers 420 and 440, which are ferromagnets, do not have a perpendicular magnetic anisotropy. Therefore, when MgO is used between ferromagnets of a storage layer, such structure cannot be used as a storage layer having perpendicular magnetization.

In contrast, in the storage device 1 according to the above first embodiment, the stacked structure 120 that functions as the storage layer includes the ferromagnet 210, the nonmagnet 220 including a boron-doped rare-earth oxide, and the ferromagnet 230. In such stacked structure 120, the ferromagnets 210 and 230 have a perpendicular magnetic anisotropy. Therefore, a storage layer having perpendicular magnetization can be realized.

A higher perpendicular magnetic anisotropy can be obtained in the case of using the boron-doped rare-earth oxide in comparison to the case of using MgO as the nonmagnet 220 because the rare-earth oxide has high boron absorption capacity. For example, when thermal treatment is applied after stacking the stacked films of FIG. 3, boron in the ferromagnet 210 and the ferromagnet 230 is absorbed in the nonmagnet 220, and the nonmagnet 220 becomes a boron-doped rare-earth oxide having a boron density higher than that in the ferromagnet 210 and the ferromagnet 230. By the boron accumulated in the nonmagnet 220, the nonmagnet 220 becomes an amorphous state, and the ferromagnet 210 and the ferromagnet 230 become a crystallized state. As a result, in the case of using the boron-doped rare-earth oxide for the nonmagnet 220, boron residue in the ferromagnet 210 and the ferromagnet 230 becomes smaller in comparison to the case of using MgO as the nonmagnet 220, which reduces distortion, and allows a high perpendicular magnetic anisotropy field to be obtained since crystallization is further accelerated.

Furthermore, according to the storage device 1 of the above first embodiment, the inversion of the magnetization of the stacked structure 120 can be realized by using a comparatively low write current in the manner explained below.

Generally, when inverting the magnetization direction of the ferromagnet, it is necessary to apply a write current that exceeds the magnitude of the energy barrier corresponding to the thermal stability of the ferromagnet. On the other hand, the perpendicular magnetic anisotropy field (Hk), the ferromagnetic resonance frequency (f) of magnetization, the damping constant ($\alpha$) of magnetization, and (or) the amount of magnetization (Mst) of the ferromagnets 210 and 230 have the magnitude relationship as mentioned above. As explained with reference to FIG. 5 and FIG. 6, this allows the magnetization directions of the ferromagnets 210 and 230 to be orderly and independently inverted. Therefore, as explained with reference to FIG. 5 and FIG. 6, the magnetization direction of the stacked structure 120 can be inverted by inverting the magnetizations of the ferromagnets 210 and 230 utilizing the STT between the ferromagnets 210 and 230. Accordingly, the write current in the first embodiment is lower than the write current in the case where the perpendicular magnetic anisotropy field, the ferromagnetic resonance frequency of the magnetization, the damping constant of the magnetization, and (or) the amount of magnetization of the ferromagnets 210 and 230 are the same.

Furthermore, by utilizing the VCMA effect caused by the nonmagnet 220 including, for example, the boron-doped rare-earth oxide, it is also possible to lower the energy barrier of the inversion of the magnetization direction of the stacked structure 120 to a further extent.

Modified Examples

In the first embodiment, the energy barrier of the inversion of the magnetization direction of the stacked structure 120 was explained to be lowered by utilizing the VCMA effect caused by the nonmagnet 220 including, for example, the boron-doped rare-earth oxide. For example, as a method of lowing the energy barrier using a voltage drop in the similar manner as the VCMA effect, the following method may be used.

For example, the ferromagnet 210 may be configured to include iridium (Ir). The ferromagnet 230 may also be configured to include platinum (Pt). This will realize a voltage drop in the similar manner as the VCMA effect, which will allow the energy barrier of the inversion of the magnetization direction of the stacked structure 120 to be lowered to a further extent.

Other Embodiments

In this specification, the term "couple" means an electrical coupling, and does not exclude intervention of another element.

The resistance change element explained in the first embodiment and the modified example mentioned above is explained regarding a case in which the resistance change element is a bottom-free type, in which the stacked structure functioning as, for example, a storage layer is provided lower than the ferromagnet functioning as, for example, a reference layer. However, the resistance change element is not limited to this. For example, the resistance change element may also be a top-free type, in which the stacked structure functioning as, for example, a storage layer is provided higher than the ferromagnet functioning as, for example, a reference layer.

Furthermore, in the first embodiment and the modified example mentioned above, the magnetic storage device including an MTJ element is explained as an example of the storage device including the resistance change element; however, the device according to these embodiments is not limited thereto. For example, the device according to these embodiments includes another device that requires a magnetic element having perpendicular magnetic anisotropy, such as a sensor or media. The magnetic element is, for example, an element that includes at least a stacked structure including two ferromagnets and a nonmagnet provided therebetween that functions as, for example, a storage layer, as explained with reference to FIG. 3. As long as the nonmagnet that is explained to function as, for example, an under layer has conductivity, it is not limited to being a nonmagnet, and may be a ferromagnet.

Furthermore, in the first embodiment mentioned above, the write operation was explained as being performed on the resistance change element by controlling the write current; however, the operation is not limited thereto. For example, the write current control and the write voltage control may be combined and used in the write operation.

Furthermore, in the above embodiments and the modifications, the switching element of the memory cell MC is described as the select transistor which is an example of a switching element having three terminals; however, the configuration is not limited thereto. For example, the switching element having two terminals can also be applied to the above first embodiment and the modifications.

That is, the select transistor may be, for example, a switching element operating between two terminals. As one example, in a case where a voltage applied between the two terminals is equal to or less than a threshold, the switching element is in a "high resistance" state, for example, an electrically nonconductive state. In a case where a voltage applied between the two terminals is equal to or larger than a threshold, the switching element changes to a "low resistance" state, for example, an electrically conductive state. The switching element can be configured to perform this function regardless of a polarity of voltage.

In this example, the switching element may include at least one chalcogen element selected from among a group configured with tellurium (Te), selenium (Se), and sulfur (S). Alternatively, the switching element may include chalcogenide that is a compound including the chalcogen element. In addition to this, the switching element may contain at least one element selected from among the group configured with boron (B), aluminum (Al), gallium (Ga), indium (In), carbon (C), silicon (Si), germanium (Ge), tin (Sn), arsenic (As), phosphorus (P), and antimony (Sb).

As in the embodiment mentioned above, such switching element between two terminals is connected to a magnetoresistive effect element via two contact plugs. Of the two contact plugs, the contact plug on the magnetoresistive effect element side includes, for example, copper. A conductive layer (for example, a layer including tantalum) may also be provided between the magnetoresistive effect element and the contact plug including copper.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
   a resistance change element,
   wherein:
   the resistance change element comprises a stacked structure including a first ferromagnet, a second ferromagnet, and a first nonmagnet between the first ferromagnet and the second ferromagnet, the first nonmagnet including a boron-doped rare-earth oxide,
   the resistance change element comprises a third ferromagnet, and a second nonmagnet between the stacked structure and the third ferromagnet,
   the second ferromagnet is between the second nonmagnet and the first nonmagnet, and
   a perpendicular magnetic anisotropy field (Hk) of the first ferromagnet is greater than a perpendicular magnetic anisotropy field of the second ferromagnet.

2. The device according to claim 1, wherein a boron-containing rate of the first ferromagnet is higher than a boron-containing rate of the second ferromagnet.

3. The device according to claim 1, wherein a film thickness of the first ferromagnet is thinner than a film thickness of the second ferromagnet.

4. A storage device comprising:
   a resistance change element,
   wherein:
   the resistance change element comprises a stacked structure including a first ferromagnet, a second ferromagnet, and a first nonmagnet between the first ferromagnet and the second ferromagnet, the first nonmagnet including a boron-doped rare-earth oxide,
   the resistance change element comprises a third ferromagnet, and a second nonmagnet between the stacked structure and the third ferromagnet,
   the second ferromagnet is between the second nonmagnet and the first nonmagnet, and
   a ferromagnetic resonance frequency (f) of a magnetization of the first ferromagnet is greater than a ferromagnetic resonance frequency of a magnetization of the second ferromagnet.

5. The device according to claim 4, wherein a boron-containing rate of the first ferromagnet is higher than a boron-containing rate of the second ferromagnet.

6. The device according to claim 4, wherein a film thickness of the first ferromagnet is thinner than a film thickness of the second ferromagnet.

7. The device according to claim 1, wherein a damping constant ($\alpha$) of the first ferromagnet is greater than a damping constant of the second ferromagnet.

8. The device according to claim 4, wherein a damping constant ($\alpha$) of the first ferromagnet is greater than a damping constant of the second ferromagnet.

9. The device according to claim 4, wherein the first ferromagnet includes iridium (Ir), or the second ferromagnet includes platinum (Pt).

10. A storage device comprising:
    a resistance change element,
    wherein:
    the resistance change element comprises a stacked structure including a first ferromagnet, a second ferromagnet, and a first nonmagnet between the first ferromagnet and the second ferromagnet, the first nonmagnet including a boron-doped rare-earth oxide,
    the resistance change element comprises a third ferromagnet, and a second nonmagnet between the stacked structure and the third ferromagnet,
    the second ferromagnet is between the second nonmagnet and the first nonmagnet, and
    an amount of magnetization (Mst) of the first ferromagnet is smaller than an amount of magnetization of the second ferromagnet.

11. The device according to claim 10, wherein a saturation magnetization (Ms) of the first ferromagnet is smaller than a saturation magnetization of the second ferromagnet.

12. The device according to claim 10, wherein a film thickness of the first ferromagnet is thinner than a film thickness of the second ferromagnet.

13. The device according to claim 1, wherein the first ferromagnet includes iridium (Ir), or the second ferromagnet includes platinum (Pt).

14. The device according to claim 10, wherein a damping constant ($\alpha$) of the first ferromagnet is greater than a damping constant of the second ferromagnet.

15. The device according to claim 14, wherein a boron-containing rate of the first ferromagnet is higher than a boron-containing rate of the second ferromagnet.

16. The device according to claim 10, wherein the first ferromagnet includes iridium (Ir), or the second ferromagnet includes platinum (Pt).

* * * * *